United States Patent
Marr et al.

(10) Patent No.: US 6,836,000 B1
(45) Date of Patent: Dec. 28, 2004

(54) ANTIFUSE STRUCTURE AND METHOD OF USE

(75) Inventors: Kenneth W. Marr, Boise, ID (US); Shubneesh Batra, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/515,760

(22) Filed: Mar. 1, 2000

(51) Int. Cl.$^7$ .............................. H01L 29/00

(52) U.S. Cl. ...................... 257/530; 257/209

(58) Field of Search ................ 257/530, 529, 257/50, 209; 438/131, 467, 600, 957, 132

(56) References Cited

U.S. PATENT DOCUMENTS

| | | | |
|---|---|---|---|
| 4,233,671 A | 11/1980 | Gerzberg et al. | 365/105 |
| 4,387,503 A | 6/1983 | Aswell et al. | 29/575 |
| 4,488,262 A | 12/1984 | Basire et al. | 365/104 |
| 4,569,120 A | 2/1986 | Stacy et al. | 29/574 |
| 4,748,490 A | 5/1988 | Hollingsworth | 357/51 |
| 4,751,197 A | 6/1988 | Wills | 437/174 |
| 5,019,532 A | 5/1991 | Kaya | 437/186 |
| 5,057,451 A | 10/1991 | McCollum | 437/69 |
| 5,087,589 A | 2/1992 | Chapman et al. | 437/195 |
| 5,087,958 A * | 2/1992 | Chen et al. | 357/51 |
| 5,110,754 A | 5/1992 | Lowrey et al. | 437/52 |
| 5,130,777 A | 7/1992 | Galbraith et al. | 357/51 |
| 5,134,457 A | 7/1992 | Hamdy et al. | 357/51 |
| 5,148,391 A | 9/1992 | Zagar | 365/96 |
| 5,166,901 A | 11/1992 | Shaw et al. | 365/105 |
| 5,200,652 A | 4/1993 | Lee | 307/465 |
| 5,208,177 A | 5/1993 | Lee | 437/47 |
| 5,231,050 A | 7/1993 | Boudou et al. | 437/173 |
| 5,233,206 A | 8/1993 | Lee et al. | 257/50 |
| 5,241,496 A | 8/1993 | Lowrey et al. | 365/96 |
| 5,248,632 A | 9/1993 | Tung et al. | 437/195 |
| 5,250,459 A | 10/1993 | Lee | 437/52 |
| 5,257,222 A | 10/1993 | Lee | 365/96 |
| 5,257,225 A | 10/1993 | Lee | 365/185 |
| 5,264,725 A | 11/1993 | Mullarkey et al. | 257/665 |
| 5,272,097 A | 12/1993 | Shiota | 437/34 |
| 5,272,666 A | 12/1993 | Tsang et al. | 365/96 |
| 5,276,653 A | 1/1994 | McKenny | 365/225.7 |
| 5,281,553 A | 1/1994 | Boudou et al. | 437/173 |
| 5,282,158 A | 1/1994 | Lee | 365/96 |
| 5,299,150 A | 3/1994 | Galbraith et al. | 365/94 |
| 5,299,152 A | 3/1994 | Ishihara et al. | 365/96 |
| 5,301,159 A | 4/1994 | Lee | 365/225.7 |
| 5,303,199 A | 4/1994 | Ishihara et al. | 365/225.7 |
| 5,311,053 A | 5/1994 | Law et al. | 257/529 |
| 5,315,177 A | 5/1994 | Zagar et al. | 307/465 |
| 5,324,681 A | 6/1994 | Lowrey et al. | 437/52 |
| 5,331,196 A | 7/1994 | Lowrey et al. | 257/529 |
| 5,341,030 A * | 8/1994 | Galbraith | 327/525 |
| 5,412,244 A | 5/1995 | Hamdy et al. | 257/530 |

(List continued on next page.)

FOREIGN PATENT DOCUMENTS

| | | | |
|---|---|---|---|
| JP | 59105354 A | 6/1984 | H01L/27/08 |
| JP | 61046045 | 3/1986 | H01L/21/82 |

OTHER PUBLICATIONS

Donald A Neamen. 1992. The McGraw–Hill Companies, Inc. Semiconductor Physics & Devices Basic Principles, second edition. pp. 428–434 and 96–98.*

*Primary Examiner*—Steven Loke
*Assistant Examiner*—Douglas W. Owens

(57) ABSTRACT

An antifuse structure and method of use are disclosed. According to one embodiment of the present invention a first programming voltage is coupled to a well of a first conductivity type in a substrate of a second conductivity type in an antifuse. A second programming voltage is coupled to a conductive terminal of the second conductivity type in the antifuse to create a current path through an insulator between the conductive terminal and the well to program the antifuse. The first programming voltage may be coupled to an ohmic contact in the well in the antifuse.

38 Claims, 8 Drawing Sheets

U.S. PATENT DOCUMENTS

| | | | |
|---|---|---|---|
| 5,412,593 A | 5/1995 | Magel et al. | 365/96 |
| 5,444,290 A | 8/1995 | Paz De Araujo et al. | 257/530 |
| 5,448,187 A | 9/1995 | Kowalski | 326/81 |
| 5,463,244 A | 10/1995 | De Araujo et al. | 257/530 |
| 5,506,518 A | 4/1996 | Chiang | 326/41 |
| 5,508,220 A | 4/1996 | Eltoukhy et al. | 437/60 |
| 5,514,980 A * | 5/1996 | Pilling et al. | 326/38 |
| 5,552,743 A | 9/1996 | Manning | 327/567 |
| 5,579,326 A * | 11/1996 | McClure | 714/814 |
| 5,633,601 A * | 5/1997 | Nagaraj | 326/38 |
| 5,656,949 A * | 8/1997 | Yip et al. | 326/38 |
| 5,710,515 A * | 1/1998 | Teggatz et al. | 324/763 |
| 5,742,555 A * | 4/1998 | Marr et al. | 365/225.7 |
| 5,751,162 A * | 5/1998 | Mehendale et al. | 326/37 |
| 5,764,096 A | 6/1998 | Lipp et al. | 327/434 |
| 5,774,011 A | 6/1998 | Au et al. | 327/525 |
| 5,789,796 A | 8/1998 | Kang et al. | 257/530 |
| 5,811,869 A * | 9/1998 | Seyyedy et al. | 257/530 |
| 5,834,813 A | 11/1998 | Ma et al. | 257/368 |
| 5,841,789 A * | 11/1998 | McClure | 714/724 |
| 5,851,882 A | 12/1998 | Harshfield | 438/275 |
| 5,859,562 A | 1/1999 | McCollum | 327/525 |
| 5,909,049 A | 6/1999 | McCollum | 257/530 |
| 5,917,229 A * | 6/1999 | Nathan et al. | 257/529 |
| 5,952,833 A * | 9/1999 | Morgan | 324/537 |
| 5,973,380 A | 10/1999 | Cutter et al. | 257/530 |
| 5,978,248 A | 11/1999 | Marr et al. | 365/96 |
| 6,023,431 A * | 2/2000 | Cutter et al. | 365/200 |
| 6,069,064 A | 5/2000 | Cutter et al. | 438/600 |
| 6,115,283 A | 9/2000 | Hidaka | 365/149 |
| 6,180,994 B1 | 1/2001 | Bergemont et al. | 257/530 |
| 6,222,212 B1 | 4/2001 | Lee et al. | 257/207 |
| 6,233,194 B1 * | 5/2001 | Marr et al. | 365/225.7 |
| 6,242,335 B1 | 6/2001 | Sher et al. | 438/600 |
| 6,242,941 B1 * | 6/2001 | Vest et al. | 326/26 |
| 6,247,088 B1 * | 6/2001 | Seo et al. | 710/305 |
| 6,252,293 B1 * | 6/2001 | Seyyedy et al. | 257/530 |
| 6,314,539 B1 * | 11/2001 | Jacobson et al. | 714/727 |
| 6,515,931 B2 | 2/2003 | Marr et al. | 365/225.7 |

\* cited by examiner

ANTIFUSE STRUCTURE AND METHOD OF USE

FIELD OF THE INVENTION

The present invention relates generally to integrated circuits, and more particularly, to an antifuse for integrated circuits.

BACKGROUND

Integrated circuits are interconnected networks of electrical components fabricated on a common foundation called a substrate. The electrical components are typically fabricated on a wafer of semiconductor material that serves as a substrate. Various fabrication techniques, such as layering, doping, masking, and etching, are used to build millions of resistors, transistors, and other electrical components on the wafer. The components are then wired together, or interconnected, to define a specific electrical circuit, such as a processor or a memory device.

Fusible elements are employed in integrated circuits to permit changes in the configuration of the integrated circuits after fabrication. For example, fusible elements may be used to replace defective circuits with redundant circuits. Memory devices are typically fabricated with redundant memory cells. The redundant memory cells may be enabled with fusible elements after fabrication to replace defective memory cells found during a test of fabricated memory devices.

One type of fusible element is a polysilicon fuse. The polysilicon fuse comprises a polysilicon conductor fabricated to conduct electrical current on an integrated circuit. A portion of the polysilicon fuse may be evaporated or opened by a laser beam to create an open circuit between terminals of the polysilicon fuse. The laser beam may be used to open selected polysilicon fuses in an integrated circuit to change its configuration. The use of polysilicon fuses is attended by several disadvantages. Polysilicon fuses must be spaced apart from each other in an integrated circuit such that when one of them is being opened by a laser beam the other polysilicon fuses are not damaged. A bank of polysilicon fuses therefore occupies a substantial area of an integrated circuit. In addition, polysilicon fuses cannot be opened once an integrated circuit is placed in an integrated circuit package, or is encapsulated in any manner.

Another type of fusible element is an antifuse. An antifuse comprises two conductive terminals separated by an insulator or a dielectric, and is fabricated as an open circuit. The antifuse is programmed by applying a high voltage across its terminals to rupture the insulator and form an electrical path between the terminals. One common type of antifuse is an oxide-nitride-oxide (ONO) antifuse. An ONO antifuse comprises a layer of nitride sandwiched between two layers of oxide, where each layer of oxide is in contact with a polysilicon terminal. The ONO sandwich is a dielectric and the ONO antifuse functions as a capacitor before it is programmed. One disadvantage with ONO antifuses is that they are fabricated with separate, extra steps when an integrated circuit is fabricated.

Accordingly, there exists a need for improved fusible elements for use in integrated circuits.

SUMMARY OF THE INVENTION

The above mentioned and other deficiencies are addressed in the following detailed description. According to one embodiment of the present invention a first programming voltage is coupled to a well of a first conductivity type in a substrate of a second conductivity type in an antifuse. A second programming voltage is coupled to a conductive terminal of the second conductivity type in the antifuse to create a current path through an insulator between the conductive terminal and the well to program the antifuse. The first programming voltage may be coupled to an ohmic contact in the well in the antifuse. According to another embodiment of the present invention a very high positive voltage is coupled to an n+-type diffusion region in an n-type well in a p-type substrate in an antifuse from an external pin in an integrated circuit including the antifuse. A ground voltage reference is coupled to a layer of p-type polysilicon in the antifuse to create a current path through an insulating layer of oxide between the layer of p-type polysilicon and the n-type well to program the antifuse. According to another embodiment of the present invention a very negative voltage is coupled to a p+-type diffusion region in an p-type well in an n-type substrate in an antifuse from an external pin in an integrated circuit including the antifuse. A supply voltage is coupled to a layer of n-type polysilicon in the antifuse to create a current path through an insulating layer of oxide between the layer of n-type polysilicon and the p-type well to program the antifuse.

Antifuses according to embodiments of the present invention may be fabricated according to process steps used to fabricate field-effect transistors in an integrated circuit, and do not require extra process steps. In addition, the use of an external pin to couple an elevated voltage to the antifuses for programming substantially protects other portions of an integrated circuit from damage that may be caused by the elevated voltage. Other advantages of the present invention will be apparent to one skilled in the art upon an examination of the detailed description.

DETAILED DESCRIPTION

In the following detailed description of exemplary embodiments of the present invention, reference is made to the accompanying drawings which form a part hereof, and in which are shown by way of illustration specific exemplary embodiments in which the present invention may be practiced. These embodiments are described in sufficient detail to enable those skilled in the art to practice the present invention, and it is to be understood that other embodiments may be utilized and that logical, mechanical, electrical and other changes may be made without departing from the spirit or scope of the present invention. The following detailed description is, therefore, not to be taken in a limiting sense, and the scope of the present invention is defined only by the claims.

The terms wafer and substrate may be used in the following description and include any structure having an exposed surface with which to form an integrated circuit (IC) according to embodiments of the present invention. The term substrate is understood to include semiconductor wafers. The term substrate is also used to refer to semiconductor structures during fabrication, and may include other layers that have been fabricated thereupon. The term substrate includes doped and undoped semiconductors, epitaxial semiconductor layers supported by a base semiconductor, semiconductor layers supported by a base insulator, as well as other semiconductor structures well known to one skilled in the art. The term insulator is defined to include any material that is less electrically conductive than materials generally referred to as conductors by those skilled in the art.

The term "horizontal" as used in this application is defined as a plane substantially parallel to the conventional plane or surface of a wafer or substrate, regardless of the orientation of the wafer or substrate. The term "vertical" refers to a direction substantially perpendicular to the horizonal as defined above. Prepositions, such as "on," "upper," "side" (as in "sidewall"), "higher," "lower," "over" and "under" are defined with respect to the conventional plane or surface being on the top surface of the wafer or substrate, regardless of the orientation of the wafer or substrate.

P-type conductivity is conductivity associated with holes in a semiconductor material, and n-type conductivity is conductivity associated with electrons in a semiconductor material. Throughout this specification the designation "n+" refers to semiconductor material that is heavily doped n-type semiconductor material, e.g., monocrystalline silicon or polycrystalline silicon. Similarly, the designation "p+" refers to semiconductor material that is heavily doped p-type semiconductor material. The designations "n−" and "p−" refer to lightly doped n and p-type semiconductor materials, respectively.

A digital signal of 1 may also be called a high signal and a digital signal of 0 may also be called a low signal.

Figure 1:
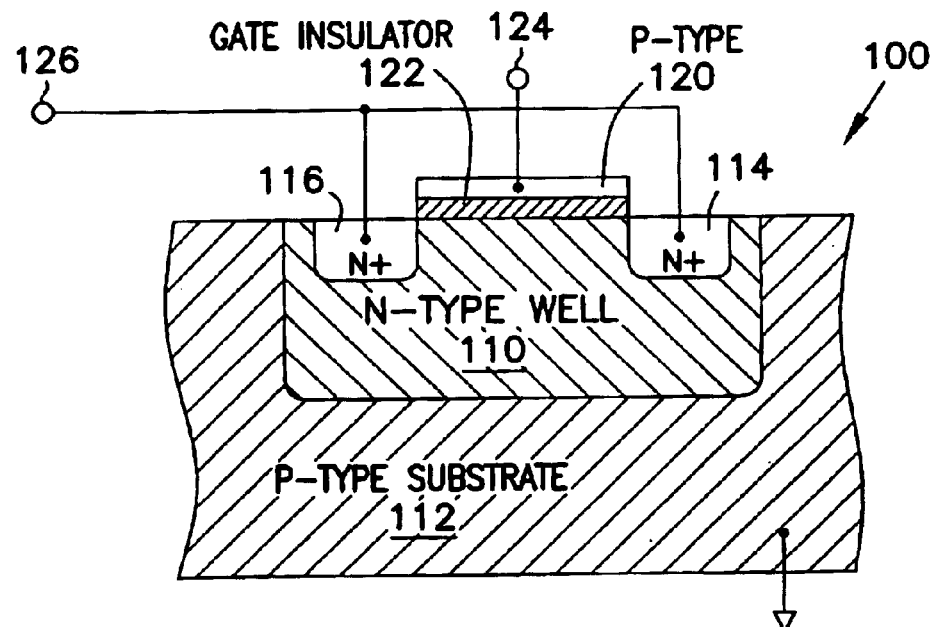
FIG. 1 is a cross-sectional view of an antifuse according to an embodiment of the present invention.

A cross-sectional view of an antifuse 100 according to an embodiment of the present invention is shown in FIG. 1. An n-type well 110 is formed in a p-type substrate 112, and an n+-type source diffusion region 114 and an n+-type drain diffusion region 116 are formed in the well 110. Each of the n+-type diffusion regions 114 and 116 provide an ohmic contact for the well 110. A p-type polysilicon gate electrode 120 is formed over a layer of gate insulator 122 which is formed over the well 110 between the source diffusion region 114 and the drain diffusion region 116. The gate electrode 120 may also be formed by layers of p-type polysilicon and a silicide such as tungsten silicide ($WSi_x$), titanium silicide ($TiSi_2$), or cobalt silicide ($CoSi_2$). The gate insulator 122 may be silicon dioxide, $SiO_2$, also called oxide, oxynitride, or nitrided oxide. The p-type polysilicon gate electrode 120 is connected to a first terminal 124 of the antifuse 100, and a second terminal 126 is connected to each of the n+-type diffusion regions 114 and 116.

Two separate circuits in an integrated circuit may be connected respectively to the first and second terminals 124, 126 of the antifuse 100. The antifuse 100 is an open circuit between the terminals until it is programmed in the following manner. The p-type substrate 112, the first terminal 124, and the p-type polysilicon gate electrode 120 are coupled to a ground voltage reference. The second terminal 126 brings the well 110 to a very high positive voltage such that a potential drop between the well 110 and the p-type polysilicon gate electrode 120 is enough to rupture the gate insulator 122. When programmed the antifuse 100 has a conductive connection between the first and second terminals 124, 126 which may be biased appropriately such that the p-n junction between the p-type polysilicon gate electrode 120 and the well 110 allows current to flow.

The antifuse 100 may be fabricated according to process steps used to fabricate field-effect transistors, but the antifuse 100 does not itself have the structure of a transistor. The well 110 and the n+-type diffusion regions 114 and 116 have the same conductivity type, and therefore the antifuse 100 cannot function as a transistor. This is important because an ordinary field effect transistor with a well of a first conductivity type in a substrate of a second conductivity type and source and drain diffusion regions of the second conductivity type has a breakdown voltage due to the parasitic diode formed by the source or the drain and the well. The breakdown voltage acts as a voltage clamp preventing the well from reaching a potential necessary to rupture a gate insulator. The antifuses described herein according to the embodiments of the present invention each have diffusion regions in a well of the same conductivity type as the well, and therefore no parasitic diode. As a result the well may be taken to a potential high enough to rupture a gate insulator.

Figure 2:
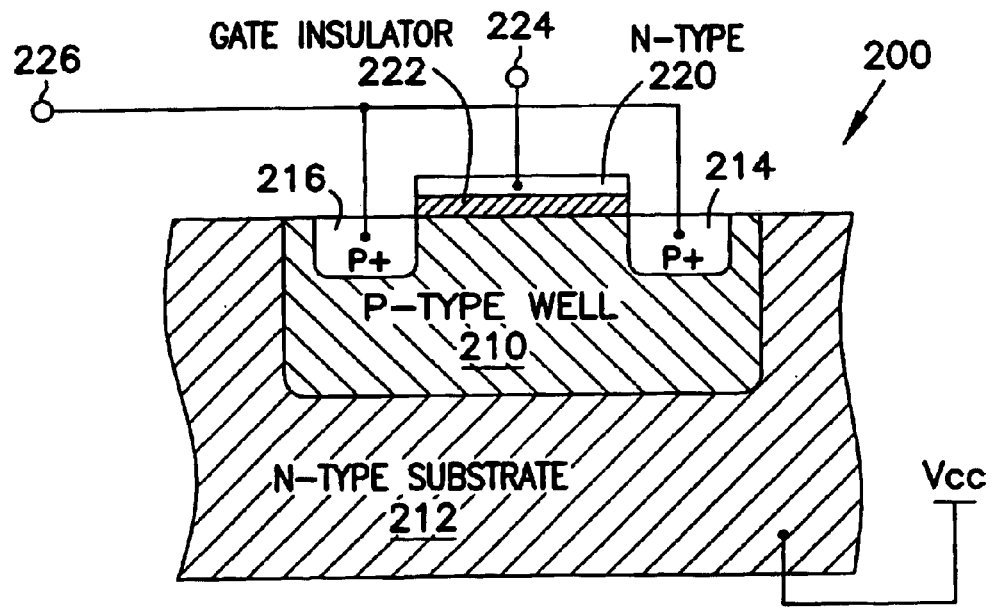
FIG. 2 is a cross-sectional view of an antifuse according to an embodiment of the present invention.

A cross-sectional view of an antifuse 200 according to another embodiment of the present invention is shown in FIG. 2. A p-type well 210 is formed in an n-type substrate 212, and a p+-type source diffusion region 214 and a p+-type drain diffusion region 216 are formed in the well 210. Each of the p+-type diffusion regions 214 and 216 provide an ohmic contact for the well 210. An n-type polysilicon gate electrode 220 is formed over a layer of gate insulator 222 which is formed over the well 210 between the source diffusion region 214 and the drain diffusion region 216. The gate electrode 220 may also be formed by layers of n-type polysilicon and a silicide such as tungsten silicide ($WSi_x$), titanium silicide ($TiSi_2$), or cobalt silicide ($CoSi_2$). The gate insulator 222 may be oxide, oxynitride, or nitrided oxide. The n-type polysilicon gate electrode 220 is connected to a first terminal 224 of the antifuse 200, and a second terminal 226 is connected to each of the p+-type diffusion regions 214 and 216.

The antifuse 200 is an open circuit between the first and second terminals 224, 226 until it is programmed in the following manner. The n-type substrate 212, the first terminal 224, and the n-type polysilicon gate electrode 220 are coupled to a supply voltage VCC which is approximately 1–5 volts. The second terminal 226 brings the well 210 to a very negative voltage such that a potential drop between the well 210 and the n-type polysilicon gate electrode 220 is enough to rupture the gate insulator 222. When programmed the antifuse 200 has a conductive connection between the first and second terminals 224, 226 which may be biased appropriately such that the p-n junction between the n-type polysilicon gate electrode 220 and the well 210 allows current to flow.

Figure 3A:
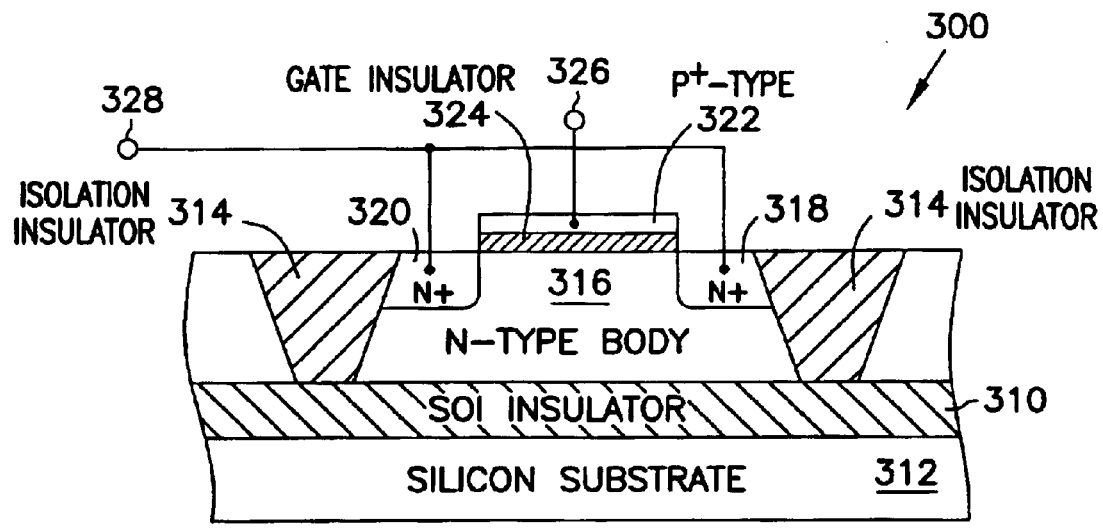
FIG. 3A is a cross-sectional view of an antifuse according to an embodiment of the present invention.

A cross-sectional view of an antifuse 300 according to an embodiment of the present invention is shown in FIG. 3A. The antifuse 300 is formed as a silicon-on-insulator (SOI) device. A SO insulator 310 is formed on a silicon substrate 312, and a layer of n-type silicon is formed on the SOI insulator 310. A shallow trench isolation insulator 314 is formed in the layer of n-type silicon to isolate an n-type body 316. An n+-type source diffusion region 318 and an n+-type drain diffusion region 320 are formed in the n-type body 316. Each of the n+-type diffusion regions 318 and 320 provide an ohmic contact for the n-type body 316. A p+-type polysilicon gate electrode 322 is formed over a layer of gate insulator 324 which is formed over the n-type body 316 between the source diffusion region 318 and the drain diffusion region 320. The gate electrode 322 may also be formed by layers of p+-type polysilicon and a silicide such as tungsten silicide ($WSi_x$), titanium silicide ($TiSi_2$), or cobalt silicide ($CoSi_2$). The SOI insulator 310, the isolation insulator 314, and the gate insulator 324 may be silicon dioxide, $SiO_2$, also called oxide, oxynitride, or nitrided oxide. The p+-type polysilicon gate electrode 322 is connected to a first terminal 326 of the antifuse 300, and a second terminal 328 is connected to each of the n+-type diffusion regions 318 and 320.

The antifuse 300 is an open circuit between the terminals 326, 328 until it is programmed by applying a potential drop across the terminals 326, 328 sufficient to rupture the gate insulator 324. The n-type body 316 is electrically isolated by oxide, and therefore will not break down when the antifuse 300 is being programmed. The potential drop across the terminals 326, 328 may be achieved by applying any combination of voltages to the terminals 326, 328. For example, the first terminal 326 may be coupled to a ground voltage reference while a very high positive voltage is applied to the second terminal 328. The antifuse 300 may also be programmed by coupling the second terminal 328 to a ground voltage reference and applying a very high positive voltage to the first terminal 326. When programmed the antifuse 300 has a conductive connection between the first and second terminals 326, 328 which may be biased appropriately such that the junction between the terminals allows current to flow.

Figure 3B:
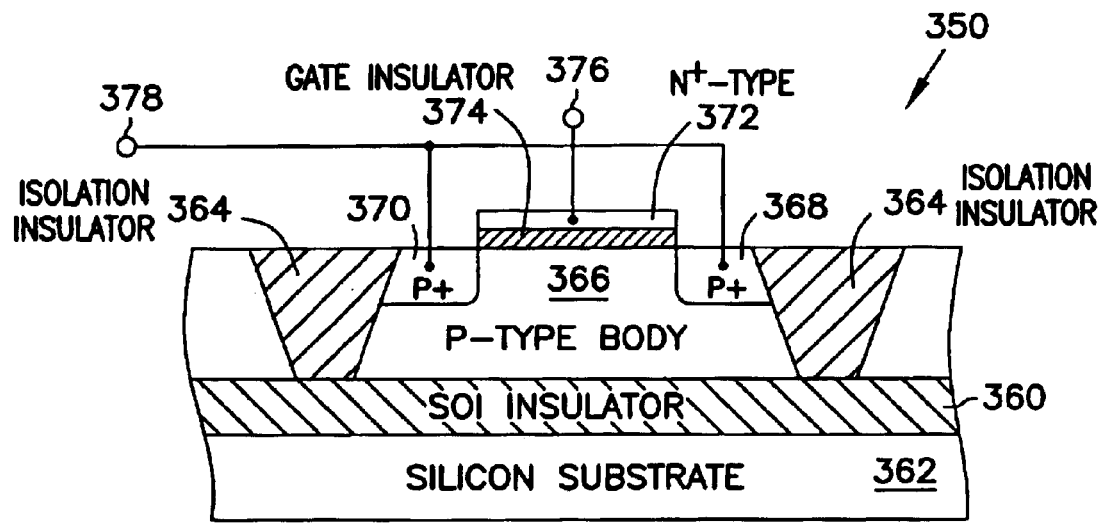
FIG. 3B is a cross-sectional view of an antifuse according to an embodiment of the present invention.

A cross-sectional view of an antifuse 350 according to an embodiment of the present invention is shown in FIG. 3B. The antifuse 350 is formed as a silicon-on-insulator (SOI) device. A SOI insulator 360 is formed on a silicon substrate 362, and a layer of p-type silicon is formed on the SOI insulator 360. A shallow trench isolation insulator 364 is formed in the layer of p-type silicon to isolate a p-type body 366. A p+-type source diffusion region 368 and a p+-type drain diffusion region 370 are formed in the p-type body 366. Each of the p+-type diffusion regions 368, 370 provide an ohmic contact for the p-type body 366. An n+-type polysilicon gate electrode 372 is formed over a layer of gate insulator 374 which is formed over the p-type body 366 between the source diffusion region 368 and the drain diffusion region 370. The gate electrode 372 may also be formed by layers of n+-type polysilicon and a silicide such as tungsten silicide ($WSi_x$), titanium silicide ($TiSi_2$), or cobalt silicide ($CoSi_2$). The SOI insulator 360, the isolation insulator 364, and the gate insulator 374 may be silicon dioxide, $SiO_2$, also called oxide, oxynitride, or nitrided oxide. The n+-type polysilicon gate electrode 372 is connected to a first terminal 376 of the antifuse 350, and a second terminal 378 is connected to each of the p+-type diffusion regions 368, 370. The antifuse 350 may be programmed in a manner similar to the programming of the antifuse 300, and is operated in a similar manner.

Figure 4A:
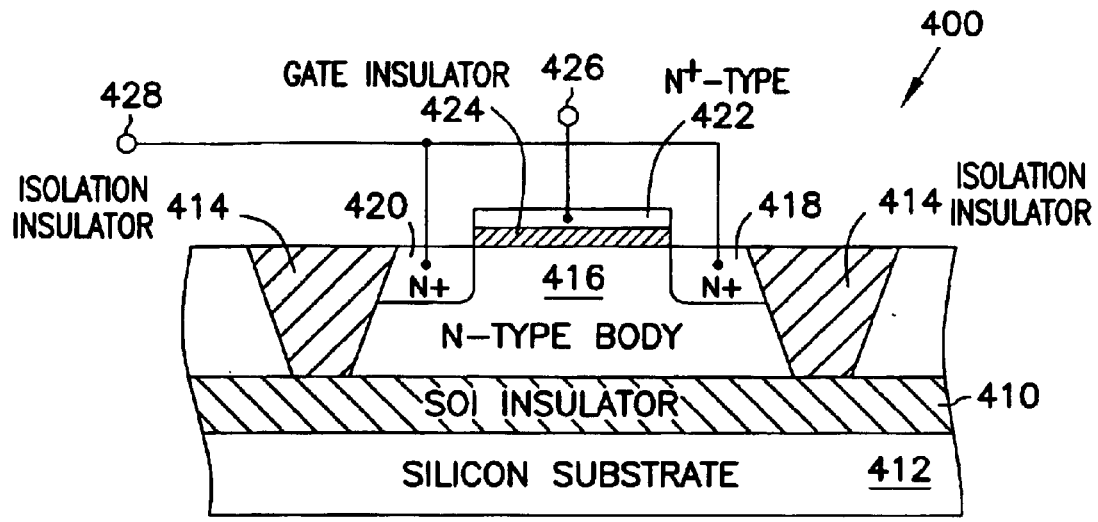
FIG. 4A is a cross-sectional view of an antifuse according to an embodiment of the present invention.

A cross-sectional view of an antifuse 400 according to an embodiment of the present invention is shown in FIG. 4A. The antifuse 400 is formed as a silicon-on-insulator (SOI) device. A SOI insulator 410 is formed on a silicon substrate 412, and a layer of n-type silicon is formed on the SOI insulator 410. A shallow trench isolation insulator 414 is formed in the layer of n-type silicon to isolate an n-type body 416. An n+-type source diffusion region 418 and an n+-type drain diffusion region 420 are formed in the n-type body 416. Each of the n+-type diffusion regions 418 and 420 provide an ohmic contact for the n-type body 416. An n+-type polysilicon gate electrode 422 is formed over a layer of gate insulator 424 which is formed over the n-type body 416 between the source diffusion region 418 and the drain diffusion region 420. The gate electrode 422 may also be formed by layers of n+-type polysilicon and a silicide such as tungsten silicide ($WSi_x$), titanium silicide ($TiSi_2$), or cobalt silicide ($CoSi_2$). The SOI insulator 410, the isolation insulator 414, and the gate insulator 424 may be silicon dioxide, $SiO_2$, also called oxide, oxynitride, or nitrided oxide. The n+-type polysilicon gate electrode 422 is connected to a first terminal 426 of the antifuse 400, and a second terminal 428 is connected to each of the n+-type diffusion regions 418 and 420. The antifuse 400 may be programmed in a manner similar to the programming of the antifuse 300, and is operated in a similar manner. However, programming of the antifuse 400 does not result in a p-n junction between the terminals 426, 428.

Figure 4B:
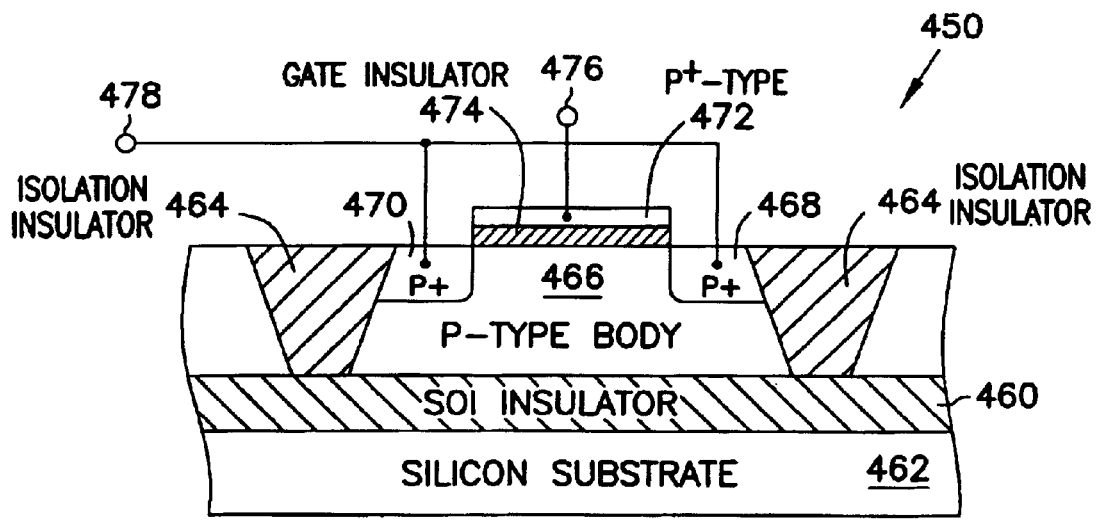
FIG. 4B. is a cross-sectional view of an antifuse according to an embodiment of the present invention.

A cross-sectional view of an antifuse 450 according to an embodiment of the present invention is shown in FIG. 4B. The antifuse 450 is formed as a silicon-on-insulator (SOI) device. A SOI insulator 460 is formed on a silicon substrate 462, and a layer of p-type silicon is formed on the SOI insulator 460. A shallow trench isolation insulator 464 is formed in the layer of p-type silicon to isolate a p-type body 466. A p+-type source diffusion region 468 and a p+-type drain diffusion region 470 are formed in the p-type body 466. Each of the p+-type diffusion regions 468, 470 provide an ohmic contact for the p-type body 466. A p+-type polysilicon gate electrode 472 is formed over a layer of gate insulator 474 which is formed over the p-type body 466 between the source diffusion region 468 and the drain diffusion region 470. The gate electrode 472 may also be formed by layers of p+-type polysilicon and a silicide such as tungsten silicide ($WSi_x$), titanium silicide ($TiSi_2$), or cobalt silicide ($CoSi_2$). The SOI insulator 460, the isolation insulator 464, and the gate insulator 474 may be silicon dioxide, $SiO_2$, also called oxide, oxynitride, or nitrided oxide. The p+-type polysilicon gate electrode 472 is connected to a first terminal 476 of the antifuse 450, and a second terminal 478 is connected to each of the p+-type diffusion regions 468, 470. The antifuse 450 may be programmed in a manner similar to the programming of the antifuse 300, and is operated in a similar manner. However, programming of the antifuse 450 does not result in a p-n junction between the terminals 476, 478.

Figure 5:
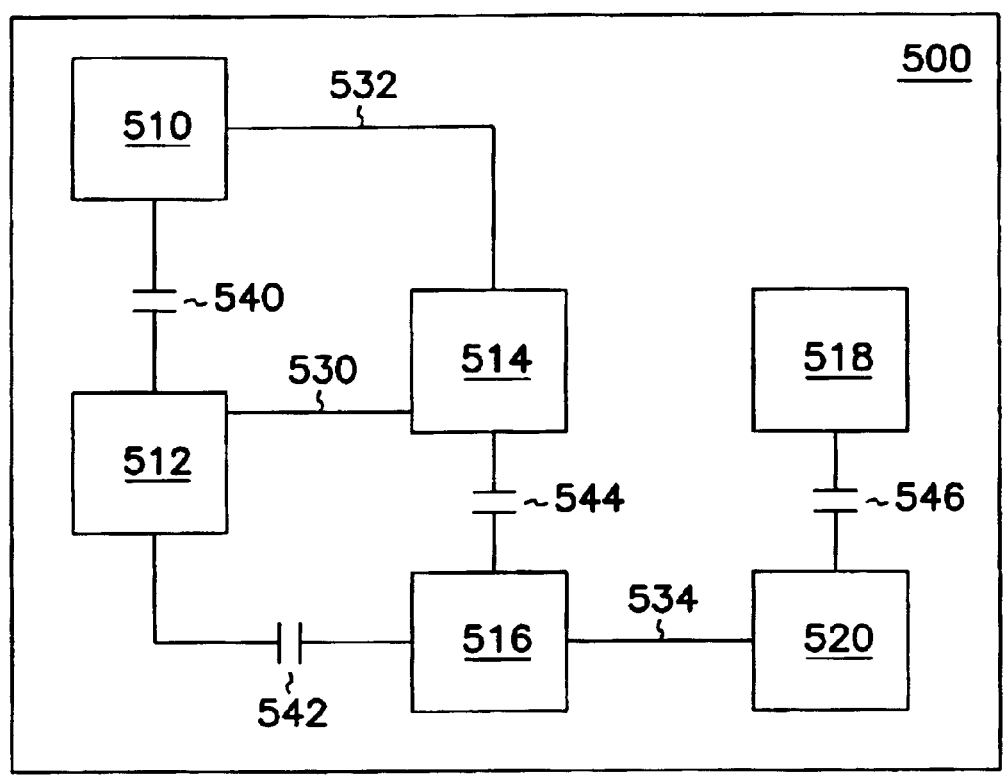
FIG. 5 is an electrical schematic diagram of a portion of an integrated circuit according to an embodiment of the present invention.

An electrical schematic diagram of a portion of an integrated circuit 500 is shown in FIG. 5 according to an embodiment of the present invention. The integrated circuit 500 may be a memory device, a processor, or any other type of integrated circuit device. The integrated circuit 500 includes a number of circuits 510, 512, 514, 516, 518, and 520 coupled together by a number of direct connections 530, 532, and 534 and four antifuses 540, 542, 544, and 546. The antifuses 540–546 are represented as capacitors having two conductive terminals separated by an insulator to form an open circuit. One or more of the antifuses 540–546 has the structure and the operational method of one of the antifuses shown in FIGS. 1, 2, 3, and 4 and described above. One or more of the antifuses 540–546 is programmed according to the methods discussed above to provide electrically conductive couplings between two or more of the circuits 510–520 to change the configuration of the integrated circuit 500. The antifuses 540–546 may be programmed to provide a coupling to redundant circuits, to change a mode of operation of the integrated circuit 500, or to provide identification for the integrated circuit 500. The circuits 510–520 may be separate components or devices as well as circuits, and the integrated circuit 500 could include more or less circuits, devices, components, and antifuses according to alternate embodiments of the present invention.

Figure 6:
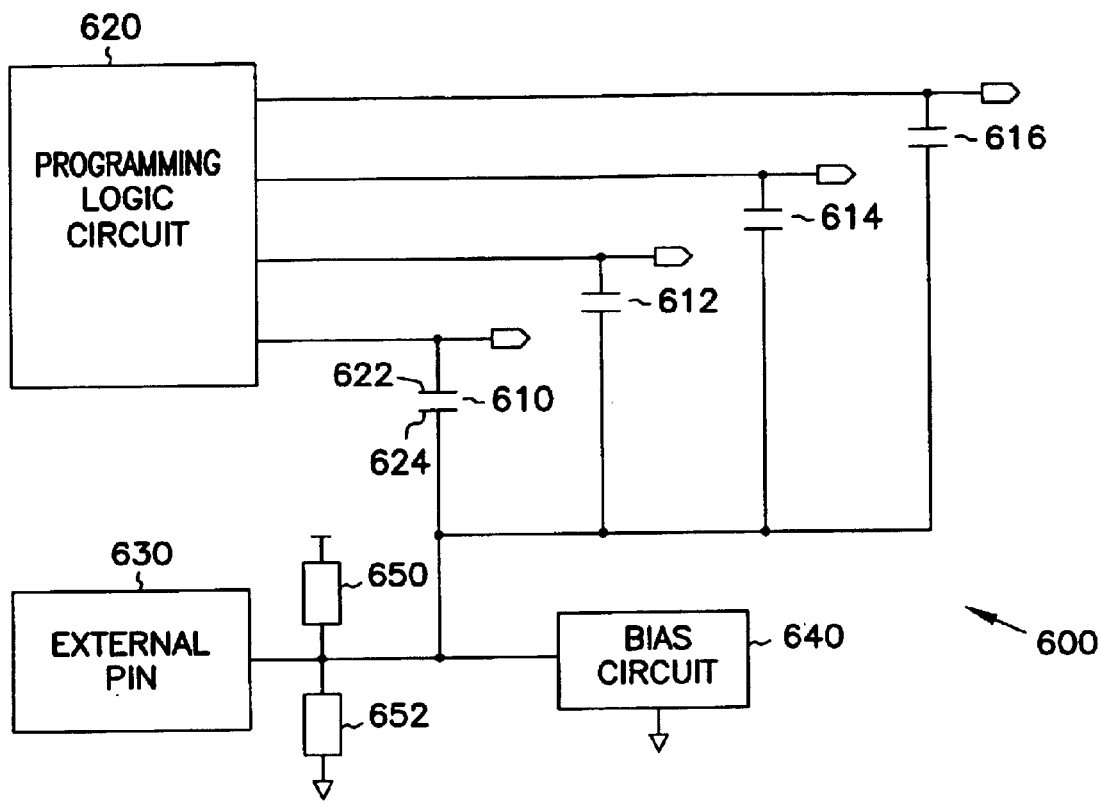
FIG. 6 is an electrical schematic diagram of an antifuse bank according to an embodiment of the present invention.

Antifuses according to embodiments of the present invention described above may be arranged in banks of antifuses in an integrated circuit, and an antifuse bank 600 is shown in FIG. 6 according to an embodiment of the present invention. The bank 600 includes four antifuses 610, 612, 614, and 616, one or more having the structure and the operational method of one of the antifuses described above with respect to FIGS. 1–4. The bank 600 may have more or less antifuses according to alternate embodiments of the CD present invention. The antifuses 610–616 are coupled in parallel to a programming logic circuit 620, and each of the antifuses 610–616 may be programmed in a similar manner. The operation of the bank 600 will be described with reference to the antifuse 610 as an example for purposes of brevity. The antifuse 610 has a gate electrode 622 coupled to the programming logic circuit 620 and a well 624 coupled to an external pin 630 and a bias circuit 640. The gate electrode 622 and the well 624 correspond to the gate electrode and the well of one of the antifuses described above with respect to FIGS. 1–4. The external pin 630 is external to an integrated circuit including the bank 600, and will be more fully described hereinbelow. The bias circuit 640 will also be more fully described hereinbelow. The well 624 is also coupled to an electrostatic discharge (ESD) device 650, 652.

The antifuses 610–616 are programmed in a programming mode of operation that occurs when the integrated circuit including the bank 600 is not in a normal mode of operation. The programming mode may be used to customize the configuration of the integrated circuit. An elevated voltage is applied to the external pin 630 that exceeds a supply voltage VCC of the integrated circuit by a substantial amount. The elevated voltage provides the potential necessary to rupture the gate insulators of the antifuses 610–616 selected to be programmed. The elevated voltage is removed from the external pin 630 during the normal mode of operation of the integrated circuit. During the normal mode of operation, the integrated circuit operates from the supply voltage VCC, which may be 1–5 volts, and the external pin 630 floats or is coupled to a ground voltage reference. The use of the external pin 630 to couple the elevated voltage to the antifuses 610–616 for programming substantially protects other portions of the integrated circuit from damage that may be caused by the elevated voltage.

The antifuses 610–616 may be similar to the antifuse 100 shown in FIG. 1, and a programming of one of the antifuses 100 in the bank 600 will now be described. In the in programming mode the p-type substrate 112 is coupled to a ground voltage reference, or a slightly negative voltage. A very high voltage, such as 20 volts, is coupled to the well 110 from the external pin 630 through the second terminal 126 and the diffusion regions 114 and 116. The anti fuse 100 is selected to be programmed by the programming logic circuit 620 which couples the ground voltage reference to the p-type polysilicon gate electrode 120 through the first terminal 124. An elevated potential difference of approximately 20 volts is thereby applied to rupture the gate insulator 122 in the antifuse 100. The programming logic circuit 620 may prevent others of the antifuses 610–616 from being programmed by coupling the supply voltage VCC to the p-type polysilicon control gates 120 such that a potential difference of approximately 15 volts is applied across the gate insulators 122 and they are not ruptured.

The antifuses 610–616 may be similar to the antifuse 200 shown in FIG. 2, and a programming of one of the antifuses 200 in the bank 600 will now be described. In the programming mode the n-type substrate 212 is coupled to the supply voltage VCC and an elevated negative voltage, such as −15 volts, is coupled to the well 210 from the external pin 630 through the second terminal 226 and the diffusion regions 214, 216, and 218. The antifuse 200 is selected to be programmed by the programming logic circuit 620 which couples the supply voltage VCC to the n-type polysilicon gate electrode 220 through the first terminal 224. An elevated potential difference of approximately 20 volts is thereby applied to rupture the gate insulator 222 in the antifuse 200. The programming logic circuit 620 may prevent others of the antifuses 610–616 from being programmed by coupling a ground voltage reference to the n-type polysilicon gate electrode 220 such that a potential difference of approximately 15 volts is applied across the gate insulator 222 and it is not ruptured. Those skilled in the art having the benefit of this description will recognize that the voltage levels recited herein may be changed depending on characteristics of the antifuses in the bank 600.

The bias circuit 640 serves several purposes. The bias circuit 640 must withstand elevated voltages applied to the external pin 630 when one or more of the antifuses 610–616 are being programmed. The bias circuit 640 must not break down and limit or clamp the elevated voltages applied to the external pin 630. The bias circuit 640 must also provide a low impedance path to a ground voltage reference for current in the antifuses 610–616 when the antifuses 610–616 are being read. If the bias circuit 640 has a low resistance then it will be able to couple a voltage only slightly higher than the ground voltage reference to the anti fuses 610–616 being read. The antifuses 610–616 are read with circuits described hereinbelow. The bias circuit 640 is not necessary if the external pin 630 is coupled to a ground voltage reference when the antifuses 610–616 are being read.

Figure 7A:
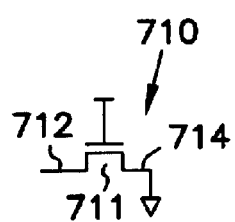
FIGS. 7A–7C are electrical schematic diagrams of bias circuits according to embodiments of the present invention.
Figure 7B:
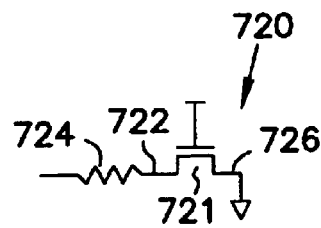
Figure 7C:
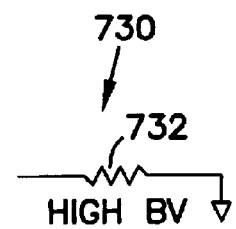

The bias circuit 640 may be implemented in one of several ways. A first bias circuit 710 shown in FIG. 7A according to an embodiment of the present invention comprises a transistor 711 having a drain 712 coupled to the external pin 630 (not shown) and a source 714 coupled to a ground voltage reference. A bias circuit 720 shown in FIG. 7B according to an embodiment of the present invention comprises a transistor 721 having a drain 722 coupled to the external pin 630 (not shown) through a polysilicon resistor 724, and a source 726 coupled to a ground voltage reference. A bias circuit 730 shown in FIG. 7C according to an embodiment of the present invention comprises a high breakdown voltage (high BV) resistor 732 coupled between the external pin 630 (not shown) and a ground voltage reference. The high BV resistor 732 may be an n-well resistor or a modified diffusion resistor.

Figure 8:
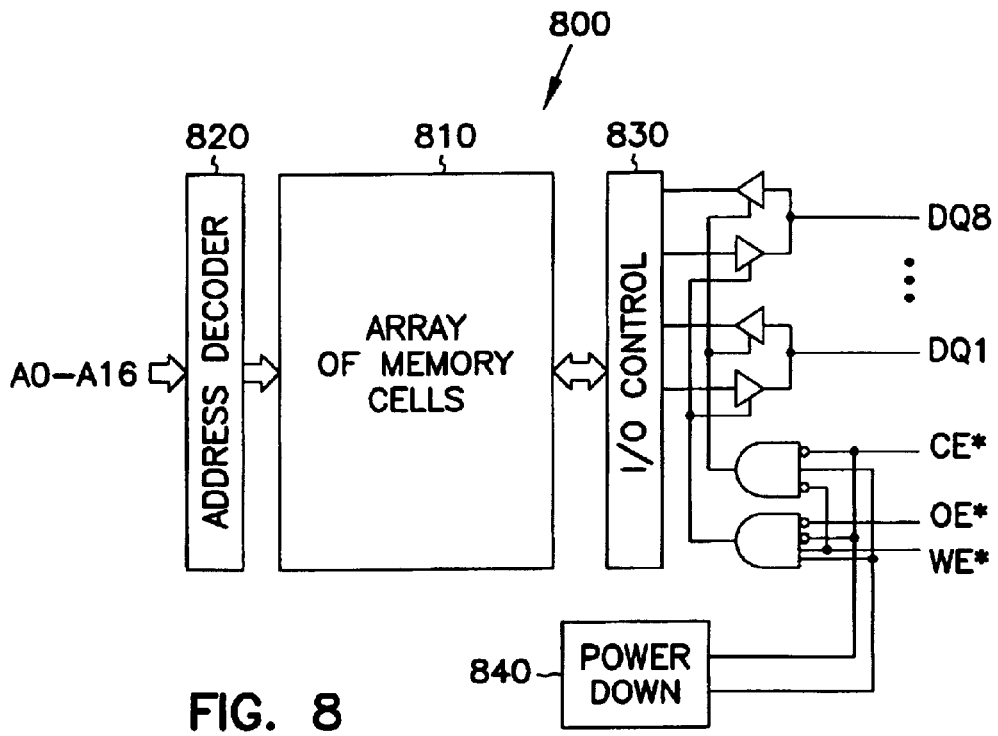
FIG. 8 is a block diagram of a static random access memory device according to an embodiment of the present invention.

A block diagram of a static random access memory device (SRAM) 800 is shown in FIG. 8 according to an embodiment of the present invention. The SRAM 800 includes one or more antifuses described above with respect to FIGS. 1–4. The SRAM 800 has an array 810 of memory cells that are accessed according to address signals provided to the SRAM 800 at a number of address inputs A0–A16. An address decoder 820 decodes the address signals and accesses memory cells in the array 810 according to the address signals. Data is written to the memory cells in the array 810 when a write enable signal WE* and a chip enable signal CE* coupled to the SRAM 800 are both low. The data is received by the SRAM 800 over eight data input/output (I/O) paths DQ1–DQ8. The data is coupled to the memory cells in the array 810 from the I/O paths DQ1–DQ8 through an I/O control circuit 830. Data is read from the memory cells in the array 810 when the write enable signal WE* is high and an output enable signal OE*coupled to the SRAM 800 and the chip enable signal CE* are both low. A power down circuit 840 controls the SRAM 800 during a power-down mode. The antifuses described above with respect to FIGS. 1–4 according to the embodiments of the present invention may be included in other types of memory devices such as DRAMs, programmable logic devices, PROMs, EPROMs, and EEPROMs.

Figure 9:
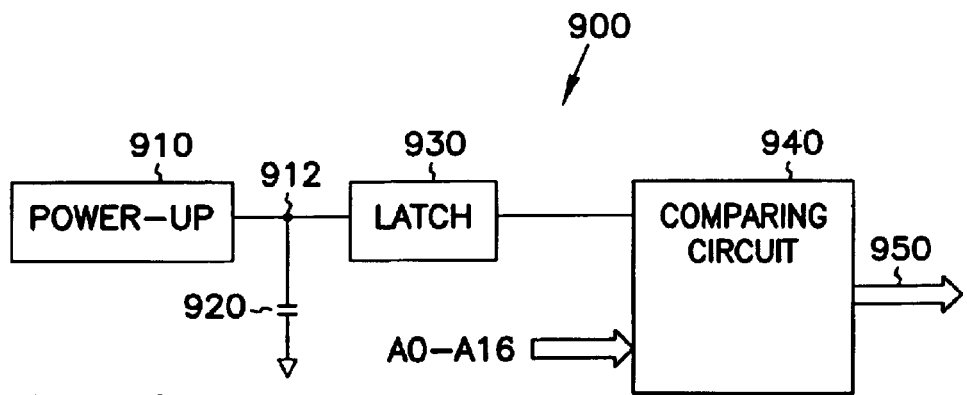
FIG. 9 is an electrical schematic diagram of a read circuit according to an embodiment of the present invention.

The antifuses in the SRAM 800 may be located in the address decoder 820 to indicate the location of redundant memory cells that are accessed instead of defective memory cells in the array 810. The antifuses in the SRAM 800 are read with a read circuit 900 shown in FIG. 9 according to an embodiment of the present invention. When the SRAM 800 is in a power-up mode to begin operating a power-up circuit 910 applies a power-up voltage to a first terminal 912 of an antifuse 920 in the address decoder 820. The antifuse 920 is similar to one of the antifuses described above with respect to FIGS. 1–4. A second terminal of the antifuse 920 is coupled to a ground voltage reference such that a resulting voltage at the first terminal 912 indicates the state of the antifuse 920. If the antifuse 920 is not programmed and forms an open circuit, the first terminal 912 will have a voltage near the power-up voltage. If the antifuse 920 is programmed the first terminal 912 will have a voltage near the ground voltage reference. The voltage at the first terminal 912 is latched by a latch circuit 930 in the power-up mode and the latch circuit 930 retains the state of the antifuse 920 while the SRAM 800 is operating. A comparing circuit 940 in the address decoder 820 is coupled to the latch circuit 930 and compares the state of the antifuse 920 with the address signals at the address inputs A0–A16. The comparing circuit 940 generates a set of output address signals on a set of address lines 950 such that the appropriate memory cells, and redundant memory cells, are accessed in the array 810 and that the defective memory cells are bypassed.

Figure 10:
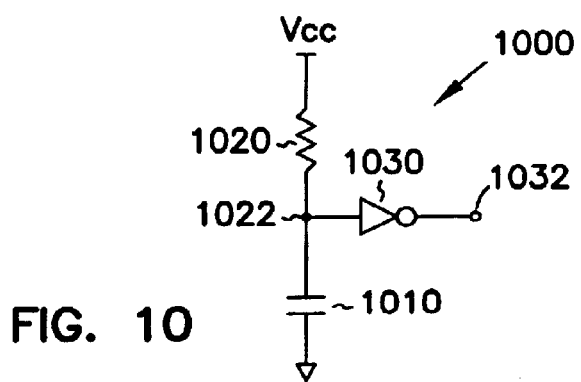
FIG. 10 is an electrical schematic diagram of a read circuit according to an embodiment of the present invention.

The power-up circuit 910 and the latch circuit 930 in the read circuit 900 may be replaced by a read circuit 1000 for an antifuse 1010 shown in FIG. 10 according to an embodiment of the present invention. The antifuse 1010 is similar to one of the antifuses described above with respect to FIGS. 1–4. A resistor 1020 is coupled between a supply voltage VCC and a first terminal 1022 of the antifuse 1010. A second terminal of the antifuse 1010 is coupled to a ground voltage reference. When the SRAM 800 is in operation the supply voltage VCC provides an approximately constant potential to difference across the resistor 1020 and the antifuse 1010. If the antifuse 1010 is not programmed and forms an open circuit, the first terminal 1022 will have a voltage near the supply voltage VCC. If the antifuse 1010 is programmed the potential difference will be divided between the resistor 1020 and the antifuse 1010, and the first terminal 1022 will have a voltage between the supply voltage VCC and the ground voltage reference. The first terminal 1022 is coupled to an input of a logic gate such as an inverter 1030, and an output 1032 of the inverter 1030 indicates the state of the antifuse 1010 during the operation of the SRAM 800. The output 1032 may be coupled to the comparing circuit 940 to determine the set of output address signals on the set of address lines 950. If the antifuse 1010 is programmed it will draw a small DC load current that must be dissipated by the SRAM 800.

Figure 11:
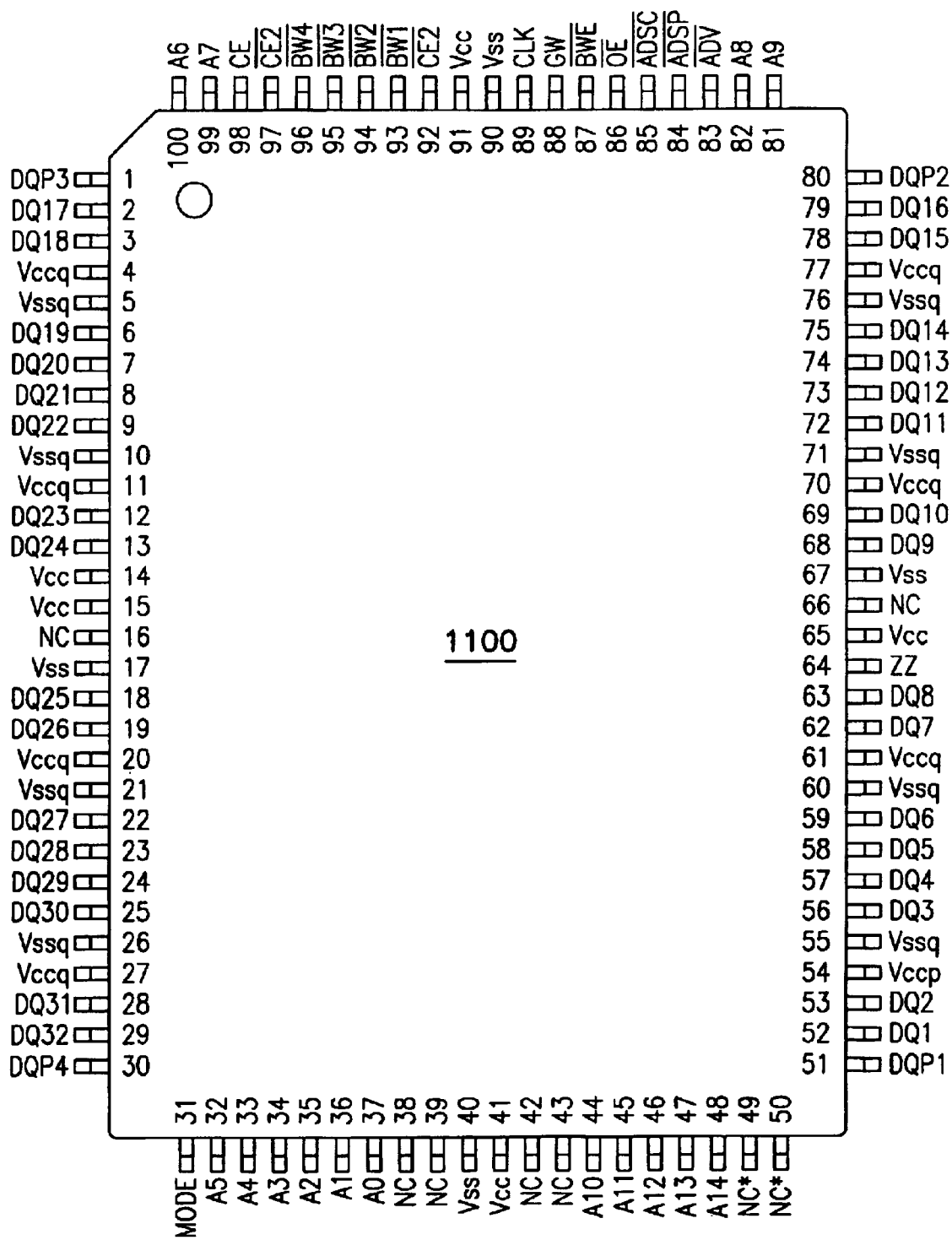
FIG. 11 is an electrical schematic diagram of an integrated circuit package according to an embodiment of the present invention.

An integrated circuit package 1100 of a 32 k×36 SRAM memory device is shown in FIG. 11 according to an embodiment of the present invention. The SRAM includes an antifuse bank similar to the bank 600 shown in FIG. 6. The external pin 630 may be one of several pins 16, 38, 39, 42, 43, or 66 in the package 1100. The pins 16, 38, 39, 42, 43, or 66 are non-reserved pins, one of which may be used as the external pin 630. The pin selected as the external pin 630 shown in FIG. 6 will receive an elevated voltage if one of the antifuses 610–616 in the bank 600 is programmed. The selected pin may be left floating or it may be soldered to a ground voltage reference during a normal operation of the SRAM.

Figure 12:
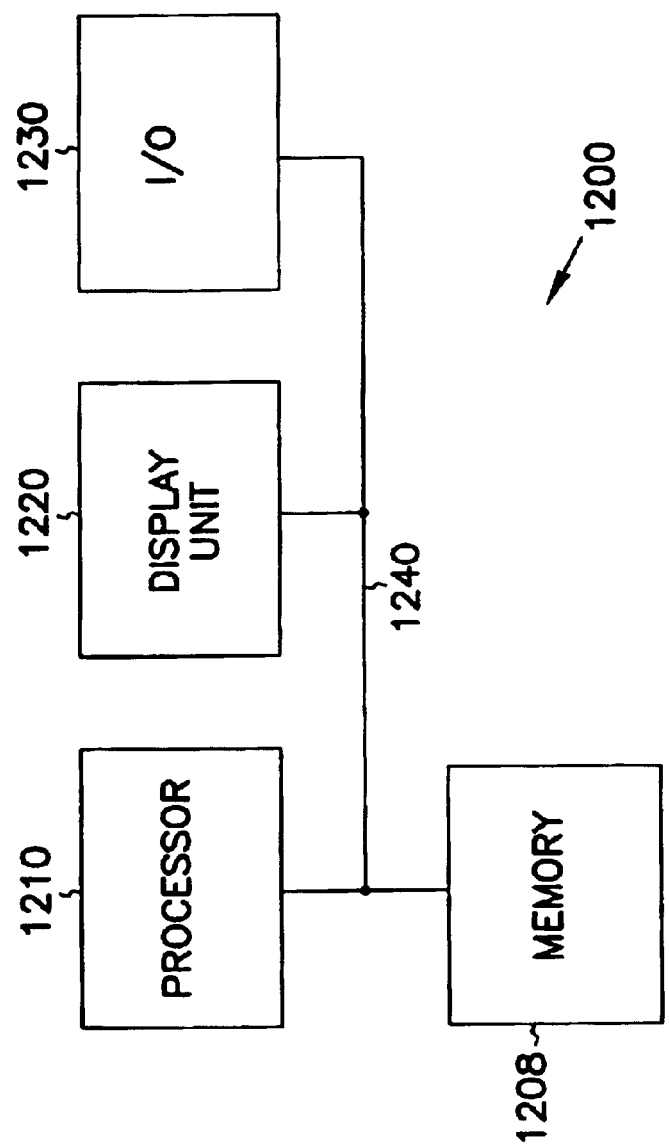
FIG. 12 is a block diagram of an information-handling system according to an embodiment of the present invention.

A block diagram of an information-handling system 1200 is shown in FIG. 12 according to an embodiment of the present invention. The information-handling system 1200 includes a memory system 1208, a processor 1210, a display unit 1220, and an input/output (I/O) subsystem 1230. The processor 1210 may be, for example, a microprocessor. One or more of the memory system 1208, the processor 1210, the display unit 1220, and the I/O subsystem 1230 may contain an antifuse bank such as the antifuse bank 600 shown in FIG. 6, or one or more of the antifuses described above with respect to FIGS. 1–4, according to embodiments of the present invention. The processor 1210, the display unit 1220, the I/O subsystem 1230, and the memory system 1208 are coupled together by a suitable communication line or bus 1240. The processor 1210 and the memory system 1208 may be integrated circuits formed on a single substrate.

In various embodiments of the present invention, the information-handling system 1200 is a computer system (such as, for example, a video game, a hand-held calculator, a television set-top box, a fixed-screen telephone, a smart mobile phone, a personal digital assistant (PDA), a network computer (NC), a hand-held computer, a personal computer, or a multi-processor supercomputer), an information appliance (such as, for example, a cellular telephone or any wireless device, a pager, or a daily planner or organizer), an information component (such as, for example, a magnetic disk drive or telecommunications modem), or other appliance (such as, for example, a hearing aid, washing machine or microwave oven having an electronic controller).

Although specific embodiments have been illustrated and described herein, it will be appreciated by those skilled in the art having the benefit of this description that any equivalent arrangement may be substituted for the specific embodiments shown. For example, specific memory devices have been described and shown in the Figures. One skilled in the art having the benefit of this description will recognize that the invention may be employed in other types of memory devices and in other types of integrated circuit devices. The present invention is therefore limited only by the claims and equivalents thereof.

What is claimed is:

1. An antifuse comprising:
   a well of a first conductivity type in a substrate of a second conductivity type;
   a first conductive terminal of the second conductivity type; and
   an insulator between the well and the first conductive terminal.

2. The antifuse of claim 1, further comprising an ohmic contact in the well as a second conductive terminal.

3. The antifuse of claim 2 wherein:
   the substrate comprises a p-type silicon substrate;
   the well comprises a n-type well in the substrate;
   the ohmic contact comprises an n+-type diffusion region;
   the insulator comprises a layer of oxide; and
   the first conductive terminal comprises a layer of p-type polysilicon.

4. The antifuse of claim 2 wherein:
   the substrate comprises a n-type silicon substrate;
   the well comprises a p-type well in the substrate;
   the ohmic contact comprises an p+-type diffusion region;
   the insulator comprises a layer of oxide; and
   the first conductive terminal comprises a layer of n-type polysilicon.

5. An integrated circuit comprising:
   a first circuit;
   a second circuit; and
   an antifuse coupled between the first circuit and the second circuit, the antifuse comprising:
      a well of a first conductivity type in a substrate of a second conductivity type;
      a first conductivity terminal of the second conductivity type; and
      an insulator between the well and the first conductivity terminal.

6. The integrated circuit of claim 5, further comprising an ohmic contact in the well as a second conductive terminal.

7. The integrated circuit of claim 6 wherein:
   the substrate comprises a p-type silicon substrate;
   the well comprises an n-type well in the substrate;
   the ohmic contact comprises an n+-type diffusion region;
   the insulator comprises a layer of oxide;
   the first conductive terminal comprises a layer of p-type polysilicon;
   the first circuit comprises a programming logic circuit; and
   the second circuit comprises an external pin and a bias circuit.

8. The integrated circuit of claim 6 wherein:
   the substrate comprises a n-type silicon substrate;
   the well comprises an p-type well in the substrate;
   the ohmic contact comprises an p+-type diffusion region;
   the insulator comprises a layer of oxide;
   the first conductive terminal comprises a layer of n-type polysilicon;
   the first circuit comprises a programming logic circuit; and
   the second circuit comprises an external pin and a bias circuit.

9. The integrated circuit of claim 5 wherein the integrated circuit comprises a memory device and further comprises an array of memory cells, an address decoder, a plurality of input/output paths, and an input/output control circuit.

10. An integrated circuit comprising:
    a programming logic circuit;
    an external pin; and
    a plurality of antifuses, each antifuse comprising:
       a well of a first conductivity type in a substrate of a second conductivity type, the well being coupled to the external pin;
       a first conductive terminal of the second conductivity type coupled to the programming logic circuit; and
       an insulator between the well and the first conductive terminal.

11. The integrated circuit of claim 10, further comprising an ohmic contact in the well coupled to the external pin.

12. The integrated circuit of claim 11 wherein:
    the substrate comprises a p-type silicon substrate;
    the well comprises an n-type well in the substrate;
    the ohmic contact comprises an n+-type diffusion region;
    the insulator comprises a layer of oxide; and
    the first conductive terminal comprises a layer of p-type polysilicon.

13. The integrated circuit of claim 11 wherein:
    the substrate comprises a n-type silicon substrate;
    the well comprises an p-type well in the substrate;
    the ohmic contact comprises an p+-type diffusion region;
    the insulator comprises a layer of oxide; and
    the first conductive terminal comprises a layer of n-type polysilicon.

14. The integrated circuit of claim 10 wherein the integrated circuit comprises a memory device and further comprises an array of memory cells, an address decoder, a plurality of input/output paths, and an input/output control circuit.

15. An antifuse bank comprising:
    a programming logic circuit;
    an external pin; and
    a plurality of antifuses, each antifuse comprising:
       a well of a first conductivity type in a substrate of a second conductivity type, the well being coupled to the external pin;
       a first conductive terminal of the second conductivity type coupled to the programming logic circuit; and
       an insulator between the well and the first conductive terminal.

16. The antifuse bank of claim 15, further comprising an ohmic contact in the well coupled to the external pin.

17. The antifuse bank of claim 16 wherein:
    the substrate comprises a p-type silicon substrate;
    the well comprises an n-type well in the substrate;
    the ohmic contact comprises an n+-type diffusion region;
    the insulator comprises a layer of oxide; and
    the first conductive terminal comprises a layer of p-type polysilicon.

18. The antifuse bank of claim 16 wherein:
    the substrate comprises a n-type silicon substrate;
    the well comprises an p-type well in the substrate;
    the ohmic contact comprises an p+-type diffusion region;
    the insulator comprises a layer of oxide; and
    the first conductive terminal comprises a layer of n-type polysilicon.

19. A method comprising:
coupling a first programming voltage to a well of a first conductivity type in a substrate of a second conductivity type in an antifuse; and
coupling a second programming voltage to a conductive terminal of the second conductivity type in the antifuse to create a current path through an insulator between the conductive terminal and the well to program the antifuse.

20. The method of claim 19 wherein coupling a first programming voltage comprises coupling a first programming voltage to an ohmic contact in the well of the first conductivity terminal and the substrate of the second conductivity type in the antifuse.

21. The method of claim 20 wherein:
coupling a first programming voltage comprises coupling a very high positive voltage to an n+-type diffusion region in an n-type well in a p-type substrate in an antifuse; and
coupling a second programming voltage comprises coupling a ground voltage reference to a layer of p-type polysilicon in the antifuse to create a current path through an insulating layer of oxide between the layer of p-type polysilicon and the n-type well to program the antifuse.

22. The method of claim 20 wherein:
coupling a first programming voltage comprises coupling a very negative positive voltage to a p+-type diffusion region in an p-type well in a n-type substrate in an antifuse; and
coupling a second programming voltage comprises coupling a supply voltage to a layer of n-type polysilicon in the antifuse to create a current path through an insulating layer of oxide between the layer of n-type polysilicon and the p-type well to program the antifuse.

23. A method of operating an integrated circuit comprising:
selecting an antifuse coupled between a first circuit and a second circuit in an integrated circuit;
coupling a first programming voltage to a well of a conductivity type in a substrate of a second conductivity type in the selected antifuse; and
coupling a second programming voltage to a conductive terminal of the second conductivity type in the selected antifuse to create a current path through an insulator between the conductive terminal and the well to program the selected antifuse.

24. The method of claim 23 wherein coupling a first programming voltage comprises coupling a first programming voltage to an ohmic contact in the well of the first conductivity type in the substrate of the second conductivity type in the selected antifuse.

25. The method of claim 24 wherein:
selecting an antifuse comprises selecting an antifuse from a plurality of antifuses coupled between a programming logic circuit and an external pin coupled to a bias circuit in the integrated circuit;
coupling a first programming voltage comprises a very high positive voltage to the external pin that is coupled to an n+-type diffusion region in an n-type well in a p-type substrate in the selected antifuse; and
coupling a second programming voltage comprises a ground voltage reference from the programming logic circuit to a layer of p-type polysilicon in the selected antifuse to create a current path through an insulating layer of oxide between the layer of p-type polysilicon and then n-type well to program the selected antifuse.

26. The method of claim 24 wherein:
selecting an antifuse comprises selecting an antifuse from a plurality of antifuses coupled between a programming logic circuit and an external pin coupled to a bias circuit in the integrated circuit;
coupling a first programming voltage comprises a very negative voltage to the external pin that is coupled to an p+-type diffusion region in an p-type well in a p-type substrate in the selected antifuse; and
coupling a second programming voltage comprises a supply voltage from the programming logic circuit to a layer of n-type polysilicon in the selected antifuse to create a current path through an insulating layer of oxide between the layer of n-type polysilicon and then p-type well to program the selected antifuse.

27. A method of operating an integrated circuit comprising:
selecting an antifuse coupled between a first circuit and a second circuit in an integrated circuit;
coupling a first programming voltage to a well of a conductivity type in a substrate of a second conductivity type in the selected antifuse; and
coupling a second programming voltage to a conductive terminal of the second conductivity type in the selected antifuse to create a current path through an insulator between the conductive terminal and the well to program the selected antifuse.

28. The method of claim 27 wherein coupling a first programming voltage comprises coupling a first programming voltage to the external pin that is coupled to an ohmic contact in the well of the first conductivity type in the substrate of the second conductivity type in the selected antifuse.

29. The method of claim 28 wherein:
selecting an antifuse comprises selecting an antifuse from a plurality of antifuses coupled between a programming logic circuit and an external pin coupled to a bias circuit in the integrated circuit;
coupling a first programming voltage comprises a very high positive voltage to the external pin that is coupled to an n+-type diffusion region in an n-type well in a p-type substrate in the selected antifuse; and
coupling a second programming voltage comprises a ground voltage reference from the programming logic circuit to a layer of p-type polysilicon in the selected antifuse to create a current path through an insulating layer of oxide between the layer of p-type polysilicon and then n-type well to program the selected antifuse.

30. The method of claim 28 wherein:
selecting an antifuse comprises selecting an antifuse from a plurality of antifuses coupled between a programming logic circuit and an external pin coupled to a bias circuit in the integrated circuit;
coupling a first programming voltage comprises a very negative voltage to the external pin that is coupled to an p+-type diffusion region in an p-type well in a n-type substrate in the selected antifuse; and
coupling a second programming voltage comprises a supply voltage from the programming logic circuit to a layer of n-type polysilicon in the selected antifuse to create a current path through an insulating layer of oxide between the layer of n-type polysilicon and then p-type well to program the selected antifuse.

31. A method comprising:

selecting circuits in a system to be coupled together;

programming an antifuse in the system to couple two or more of the selected circuits together, comprising:
coupling a first programming voltage to a well of a first conductivity type in a substrate of a second conductivity type in an antifuse; and
coupling a second programming voltage to a conductive terminal of the second conductivity type in the antifuse to create a current path through an insulator between the conductive terminal and the well to program the antifuse.

32. The method of claim 31 wherein coupling a first programming voltage comprises coupling a first programming voltage to an ohmic contact in the well of the first conductivity type in the substrate of the second conductivity type in the selected antifuse.

33. The method of claim 32 wherein:

coupling a first programming voltage comprises coupling a very high positive voltage to an n+-type diffusion region in an n-type well in a p-type substrate in an antifuse; and coupling a second programming voltage comprises coupling a ground voltage reference to a layer of p-type polysilicon in the antifuse to create a current path through an insulating layer of oxide between the layer of p-type polysilicon and the n-type well to program the antifuse.

34. The method of claim 32 wherein:

coupling a first programming voltage comprises coupling a very negative positive voltage to a p+-type diffusion region in an p-type well in a n-type substrate in an antifuse; and coupling a second programming voltage comprises coupling a supply voltage to a layer of n-type polysilicon in the antifuse to create a current path through an insulating layer of oxide between the layer of n-type polysilicon and the p-type well to program the antifuse.

35. A method of forming an antifuse comprising:

forming a well of a first conductivity type in a substrate of a second conductivity type;

forming an insulator over the well; and forming a first conductive terminal of the second conductivity type over the insulator.

36. The method of claim 35, further comprising forming an ohmic contact in the well as a second conductive terminal.

37. The method of claim 35 wherein:

forming a well comprises forming an n-type well in a p-type silicon substrate and further comprises:
forming an n+-type drain diffusion in the well;
forming an n+-type source diffusion in the well;

forming an insulator comprises forming a layer of oxide over the well between the drain diffusion region and the source diffusion region; and forming a first conductive terminal comprises forming a p-type polysilicon gate electrode over the layer of oxide.

38. The method of claim 35 wherein:

forming a well comprises forming an p-type well in a n-type silicon substrate and further comprises:
forming an p+-type drain diffusion in the well;
forming an p+-type source diffusion in the well;

forming an insulator comprises forming a layer of oxide over the well between the drain diffusion region and the source diffusion region; and forming a first conductive terminal comprises forming a n-type polysilicon gate electrode over the layer of oxide.

* * * * *

UNITED STATES PATENT AND TRADEMARK OFFICE
CERTIFICATE OF CORRECTION

PATENT NO. : 6,836,000 B1
DATED : December 28, 2004
INVENTOR(S) : Marr et al.

It is certified that error appears in the above-identified patent and that said Letters Patent is hereby corrected as shown below:

Title page,
Below *Assistant Examiner*, insert item:
-- [74] *Attorney, Agent, or Firm* - Schwegman, Lundberg, Woessner & Kluth, P.A. --.

Column 2,
Line 48, after "Fig.4B" delete ".".

Column 5,
Line 11, delete "SO" and insert -- SOI --, therefor.
Line 48, insert -- p-n -- before "junction".

Column 7,
Line 31, after "the" delete "CD".

Column 8,
Line 1, delete "In the in" and insert -- In the --, therefor.

Column 10,
Line 1, delete "to" before "difference".

Column 11,
Lines 16, 23 and 57, delete "a" and insert -- an --, therefor.
Lines 25, 58 and 59, delete "an" and insert -- a --, therefor.
Lines 37 and 39, after "first" delete "conductivity" and insert -- conductive --, therefor.

Column 12,
Lines 28 and 61, delete "a" and insert -- an --, therefor.
Lines 29, 30, 62 and 63, delete "an" and insert -- a --, therefor.

Column 13,
Line 13, delete "terminal and" and insert -- type in --, therefor.
Line 29, after "negative" delete "positive".
Line 30, delete "an" and insert -- a -- before "p-type".
Line 30, delete "a" and insert -- an --, therefor.
Line 42, insert -- first -- before "conductivity".
Line 60, after "comprises" insert -- coupling --, therefor.
Line 64, after "comprises" insert -- coupling --.

UNITED STATES PATENT AND TRADEMARK OFFICE
CERTIFICATE OF CORRECTION

PATENT NO.    : 6,836,000 B1
DATED         : December 28, 2004
INVENTOR(S)   : Marr et al.

It is certified that error appears in the above-identified patent and that said Letters Patent is hereby corrected as shown below:

Column 14,
Lines 2, 52 and 66, delete "then" and insert -- the --, therefor.
Lines 9, 13, 43, 47, 58 and 62, after "comprises" insert -- coupling --.
Lines 10, 11, 59 and 60, delete "an" and insert -- a --, therefor.
Line 11, delete "a p-type" and insert -- an n-type --, therefor.
Line 17, delete "then" and insert -- the --, therefor.
Lines 19-30, delete "A method of operating an integrated circuit comprising:

selecting an antifuse coupled between a first circuit and a second circuit in an integrated circuit;

coupling a first programming voltage to a well of a conductivity type in a substrate of a second conductivity type in the selected antifuse; and coupling a second programming voltage to a conductive terminal of the second conductivity type in the selected antifuse to create a current path through an insulator between the conductive terminal and the well to program the selected antifuse." and insert -- A method of operating an integrated circuit comprising:

selecting an antifuse coupled between a circuit and an external pin in the integrated circuit; coupling a first programming voltage to the external pin that is coupled to a well of a first conductivity type in a substrate of a second conductivity type in the selected antifuse; and coupling a second programming voltage from the circuit to a conductive terminal of the second conductivity type in the selected antifuse to create a current path through an insulator between the conductive terminal and the well to program the selected antifuse. --, therefor.

Lines 41 and 56, delete "an" and insert -- the --, therefor.
Line 60, delete "a" and insert -- an --, therefor.

Column 15,
Lines 7, 22 and 33, delete "an" and insert -- the --, therefor.
Line 18, after "the" delete "selected".
Line 33, delete "an" and insert -- a -- before "p-type".
Line 33, delete "a" and insert -- an --, therefor.

UNITED STATES PATENT AND TRADEMARK OFFICE
CERTIFICATE OF CORRECTION

PATENT NO. : 6,836,000 B1
DATED : December 28, 2004
INVENTOR(S) : Marr et al.

It is certified that error appears in the above-identified patent and that said Letters Patent is hereby corrected as shown below:

Column 16,
Lines 16, 17, 28 and 29, after "diffusion" insert -- region --, therefor.
Lines 26, 28 and 29, delete "an" and insert -- a --, therefor.
Line 26, delete "a" and insert -- an --, therefor.
Line 33, after "forming" delete "a" and insert -- an --, therefor.

Signed and Sealed this

Twenty-fourth Day of May, 2005

JON W. DUDAS
*Director of the United States Patent and Trademark Office*